United States Patent
Huang et al.

(10) Patent No.: US 6,873,011 B1
(45) Date of Patent: Mar. 29, 2005

(54) HIGH VOLTAGE AND LOW ON-RESISTANCE LDMOS TRANSISTOR HAVING EQUALIZED CAPACITANCE

(75) Inventors: Chih-Feng Huang, Jhubei (TW); Ta-yung Yang, Milpitas, CA (US); Jenn-yu G. Lin, Taipei (TW); Tuo-Hsin Chien, Tucheng (TW)

(73) Assignee: System General Corp., Taipei Hsien (TW)

( * ) Notice: Subject to any disclaimer, the term of this patent is extended or adjusted under 35 U.S.C. 154(b) by 0 days.

(21) Appl. No.: 10/786,701

(22) Filed: Feb. 24, 2004

(51) Int. Cl.[7] .............................................. H01L 29/94
(52) U.S. Cl. ...................... 257/345; 257/335; 257/339; 257/342; 257/343; 257/344
(58) Field of Search .............................. 257/335, 339, 257/342–345

(56) References Cited

U.S. PATENT DOCUMENTS

| | | | | |
|---|---|---|---|---|
| 5,155,562 A | * | 10/1992 | Tsuchiya .................... 257/343 |
| 5,932,897 A | * | 8/1999 | Kawaguchi et al. ........ 257/141 |
| 6,160,290 A | * | 12/2000 | Pendharkar et al. ........ 257/339 |
| 6,424,005 B1 | * | 7/2002 | Tsai et al. ................... 257/335 |
| 6,492,679 B1 | * | 12/2002 | Imam et al. ................. 257/342 |
| 6,756,636 B2 | * | 6/2004 | Onishi et al. ............... 257/342 |
| 2001/0038122 A1 | * | 11/2001 | Matsuzaki et al. ......... 257/339 |
| 2003/0025154 A1 | * | 2/2003 | Haynie ....................... 257/335 |
| 2003/0042541 A1 | * | 3/2003 | Rumennik et al. ......... 257/343 |
| 2003/0067036 A1 | * | 4/2003 | Depetro et al. ............ 257/335 |
| 2003/0193067 A1 | * | 10/2003 | Kim et al. .................. 257/343 |

* cited by examiner

Primary Examiner—George Eckert
Assistant Examiner—N. Drew Richards
(74) Attorney, Agent, or Firm—J.C. Patents

(57) ABSTRACT

A high voltage LDMOS transistor according to the present invention includes P-field blocks in the extended drain region of a N-well. The P-field blocks form the junction-fields in the N-well for equalizing the capacitance of parasitic capacitors between the drain region and the source region and fully deplete the drift region before breakdown occurs. A higher breakdown voltage is therefore achieved and the N-well having a higher doping density is thus allowed. The higher doping density reduces the on-resistance of the transistor. Furthermore, the portion of the N-well generated beneath the source diffusion region produces a low-impedance path for the source region, which restricts the transistor current flow in between the drain region and the source region.

7 Claims, 3 Drawing Sheets

HIGH VOLTAGE AND LOW ON-RESISTANCE LDMOS TRANSISTOR HAVING EQUALIZED CAPACITANCE

BACKGROUND OF THE INVENTION

1. Field of the Invention

The present invention relates to semiconductor devices, and more particularly to a lateral power MOSFET.

2. Description of Related Art

The development of single chip process for integrating power switches with control circuitry is a major trend in the field of power IC development. The LDMOS (lateral double diffusion MOS) process in particular is currently being applied to manufacture monolithic ICs. The LDMOS process involves performing planar diffusion on the surface of a semiconductor substrate to form a main current path oriented in the lateral direction.

A LDMOS process using a reduced surface electric field (RESURF) technique with a low thickness EPI or N-well can achieve a high voltage with low on-resistance.

In recent developments, many high-voltage LDMOS transistors have been proposed by Klas H. Eklund, in U.S. Pat. No. 4,811,075 entitled "High Voltage MOS Transistors"; by Vladimir Rumennik and Robert W. Busse, in U.S. Pat. No. 5,258,636 entitled "Narrow Radius Tips for High Voltage Semiconductor Devices with Interdigitated Source and Drain Electrodes". However, the drawback of theses prior arts is that aforementioned LDMOS transistors have higher on-resistance. Therefore, high voltage and low on-resistance LDMOS transistors are proposed by Klas H. Eklind, in U.S. Pat. No. 5,313,082 entitled "High Voltage MOS Transistor with a Low On-Resistance"; by Gen Tada, Akio Kitamura, Masaru Saito, and Naoto Fujishima, in U.S. Pat. No. 6,525,390 B2 entitled "MIS Semiconductor Device with Low On Resistance and High Breakdown Voltage"; by Vladimir Rumennik, Donald R. Disney, and Janardhanan S. Ajit, in U.S. Pat. No. 6,570,219 B1 entitled "High-voltage Transistor with Multi-layer Conductor Region"; by Masaaki Noda, in U.S. Pat. No. 6,617,652 B2 entitled "High Breakdown Voltage Semiconductor Device". Although a high voltage and low on-resistance LDMOS transistor can be manufactured, the complexity of the production processes increases the production cost and/or reduces the production yield. Another disadvantage of these proposed transistors is none-isolated source structure. The none-isolated transistor current could flow around the substrate. This may generate noise interference in the control circuit. Besides, the current of the LDMOS transistor can generate a ground bounce to disturb the control signals. In order to solve these problems, the present invention proposes a LDMOS structure to realize a high breakdown voltage, low on-resistance and isolated transistor for the monolithic integration.

SUMMARY OF THE INVENTION

A high voltage LDMOS transistor according to the present invention includes a P-substrate. A first diffusion region and a second diffusion region containing N conductivity-type ions form a N-well in the P-substrate. The first diffusion region further develops an extended drain region. A drain diffusion region containing N+ conductivity-type ions forms a drain region in the extended drain region. A third diffusion region containing P conductivity-type ions forms separated P-field blocks located in the extended drain region. The P-field blocks have different sizes. A smallest size P-field block is nearest to the drain region. A source diffusion region having N+ conductivity-type ions forms a source region in the N-well formed by the second diffusion region. A contact diffusion region containing P+ conductivity-type ions forms a contact region in the N-well formed by the second diffusion region. A fourth diffusion region containing P conductivity-type ions forms an isolated P-well in the N-well formed by the second diffusion region for preventing from breakdown. The isolated P-well located in the second diffusion region encloses the source region and the contact region. A largest size P-field block is located nearest to the source region. The P-field blocks located in the extended drain region form junction-fields in the N-well to deplete the drift region and equalize the capacitance of parasitic capacitors between the drain region and the source region. A channel is developed between the source region and the drain region extending through the N-well. The separated P-field blocks can further improve the on-resistance of the channel. A polysilicon gate electrode is formed above the portion of the channel to control a current flow in the channel. Furthermore, the portion of the N-well generated by the second diffusion region produces a low-impedance path for the source region, which restricts the current flow in between the drain region and the source region.

It is to be understood that both the foregoing general descriptions and the following detailed descriptions are exemplary, and are intended to provide further explanation of the invention as claimed. Still further objects and advantages will become apparent from a consideration of the ensuing description and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Traditional approaches to achieve a high breakdown voltage of the transistor are to divide the potential difference between the potential in a drain-to-source channel. However, the variation of the doping density may cause a poor production yield. In order to get a higher breakdown voltage and increase the transistor's production yield, the present invention further takes parasitic capacitors of the transistor as a parameter to improve the transistor structure and design, in which the capacitance of the parasitic capacitors is equalized.

Figure 1:
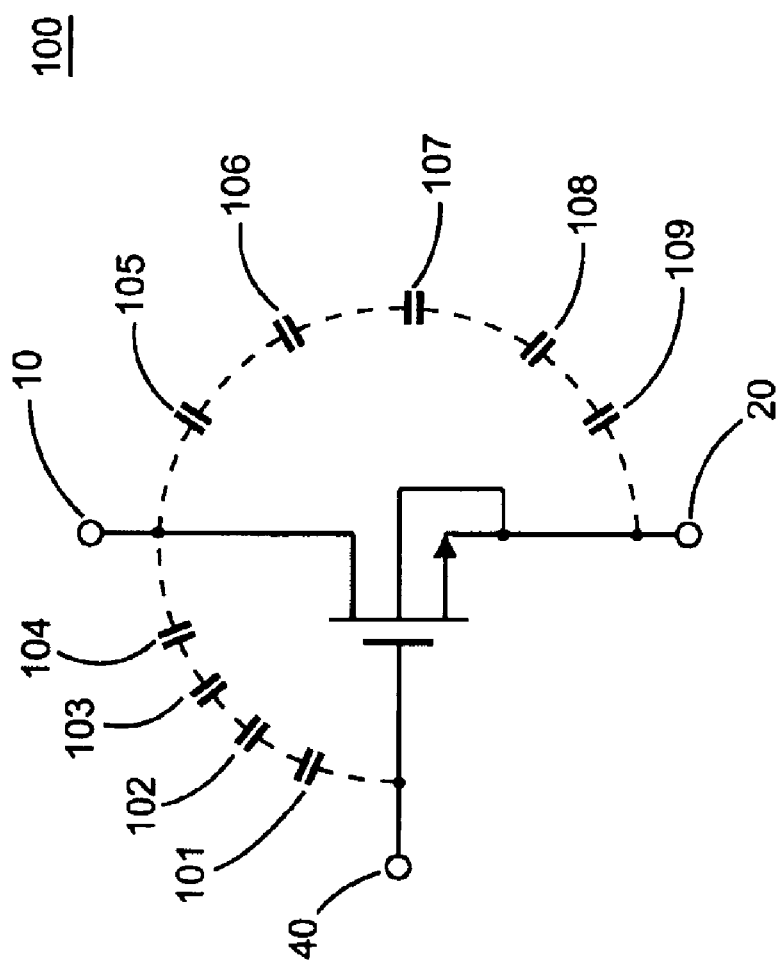
FIG. 1 shows a LDMOS transistor including parasitic capacitors according to a preferred embodiment of the present invention.

FIG. 1 shows a LDMOS transistor 100 having a drain electrode 10, a source electrode 20 and a polysilicon gate electrode 40. Between the drain electrode 10 and the polysilicon gate electrode 40 are parasitic capacitors 101, 102, 103 and 104 connected in series. Between the drain electrode 10 and the source electrode 20 are parasitic capacitors 105, 106, 107, 108 and 109 connected in series. When a high voltage is applied to the drain electrode and source electrode, the high voltage will be divided to these capacitors 105–109. If the capacitance of the parasitic capacitors is uniformly distributed, the voltage will be equally divided and therefore a higher breakdown voltage can be achieved. To facilitate the equalized capacitance, the dielectric and the geometric of the transistor must be properly controlled.

Figure 2:
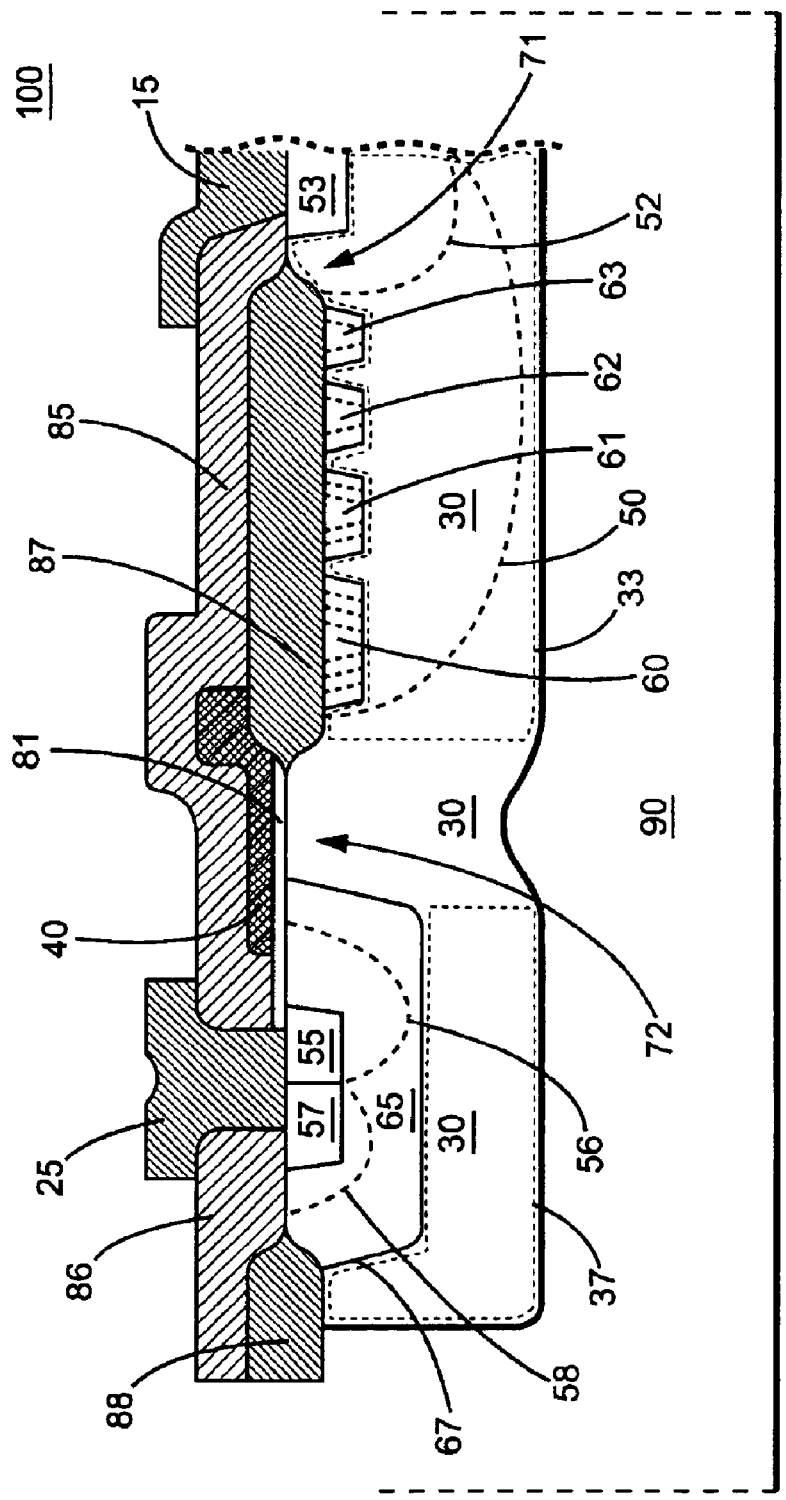
FIG. 2 is a cross-sectional view of a LDMOS transistor according to a preferred embodiment of the present invention.

FIG. 2 is a cross-sectional view of the LDMOS transistor 100 according to the present invention. The LDMOS transistor 100 includes a P-substrate 90. The LDMOS transistor 100 further includes a first diffusion region 33 and a second diffusion region 37 containing N conductivity-type ions to form an N-well 30 in the P-substrate 90. The first diffusion region 33 comprises an extended drain region 50. A drain diffusion region 53 containing N+ conductivity-type ions forms a drain region 52 in the extended drain region 50. A third diffusion region containing P conductivity-type ions forms P-field blocks 60, 61, 62 and 63 in the extended drain region 50. The P-field blocks 60, 61, 62 and 63 have different size. The size of the P-field block 60 is larger than that of the P-field block 61, 62, and 63. In a preferred embodiment, the size sequence of these P-field blocks is block 60>block 61>block 62>block 63. The P-field block 63 is nearest to the drain region 52. A source diffusion region 55 having N+ conductivity-type ions forms a source region 56 in the N-well 30 formed by the second diffusion region 37. A contact diffusion region 57 containing P+ conductivity-type ions forms a contact region 58 in the N-well 30 formed by the second diffusion region 37. A fourth diffusion region 67 containing P conductivity-type ions forms an isolated P-well 65 in the N-well 30 formed by the second diffusion region 37 for preventing from breakdown. The isolated P-well 65 encloses the source region 56 and the contact region 58. The P-field blocks 60, 61, 62 and 63 form junction-fields in the N-well 30. This depletes a drift region and equalizes the capacitance of parasitic capacitors between the drain region 52 and the source region 56.

A channel is developed between the source region 56 and the drain region 52 extending through the N-well 30. The P-field blocks 60, 61, 62 and 63 further reduce the on-resistance of the channel. A thin gate oxide 81 and a thick field oxide 87 are formed over the P-substrate 90. A polysilicon gate electrode 40 is formed above the gate oxide 81 and the field oxide 87 to control a current flow in the channel. A drain-gap 71 is formed between the drain diffusion region 53 and the field oxide 87 to maintain a space between the drain diffusion region 53 and the field oxide 87. A source-gap 72 is formed between the field oxide 87 and the isolated P-well 65 to maintain a space between the field oxide 87 and the isolated P-well 65. Proper placement of the source-gap 72 and the drain-gap 71 can substantially increase the breakdown voltage of the LDMOS transistor 100. In addition, the drain-gap 71 can further reduce the on-resistance of the channel.

Insulation layer 85 and 86 cover the polysilicon gate electrode 40 and the field oxide 87 and 88. The insulation layers 85 and 86 are, for example, made of silicon dioxide. A drain metal contact 15 is a metal electrode for contacting with the drain diffusion region 53. A source metal contact 25 is a metal electrode for contacting with the source diffusion region 55 and the contact diffusion region 57.

Figure 3:
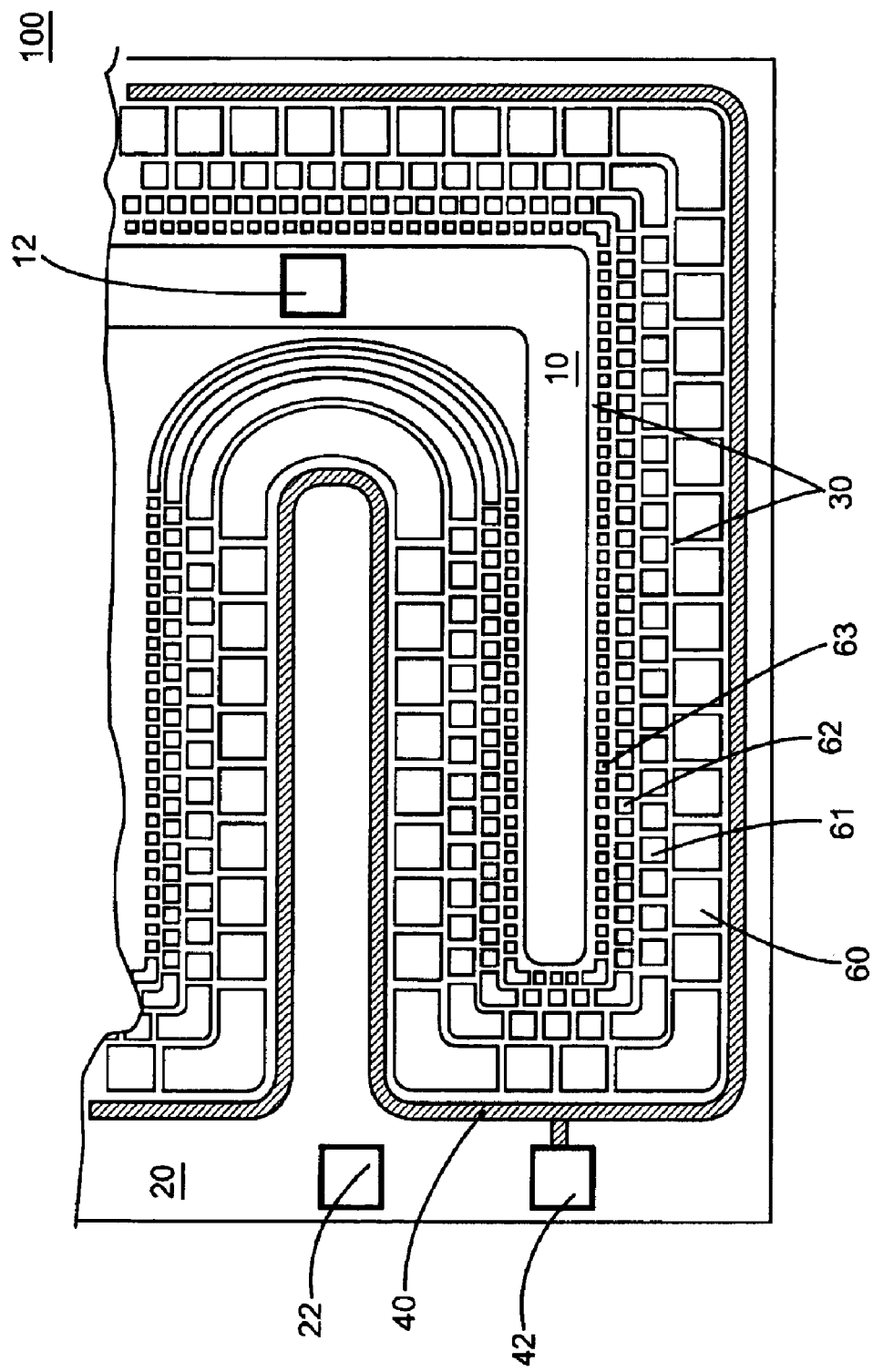
FIG. 3 shows a top view of the LDMOS transistor shown in FIG. 2 of the present invention.

FIG. 3 is a top view of the proposed LDMOS transistor 100. The LDMOS transistor 100 includes the drain electrode 10, the source electrode 20, the polysilicon gate electrode 40, a bonding pad 12 for the drain electrode 10, a bonding pad 22 for the source electrode 20, a bonding pad 42 for the polysilicon gate electrode 40. Referring to FIG. 2 and FIG. 3, the extended drain region 50 and the drain diffusion region 53 both form the drain electrode 10. The isolated P-well 65, the source diffusion region 55 and the contact diffusion region 57 form the source electrode 20. The bonding pad 12 is connected to the drain metal contact 15 for the drain electrode 10. The bonding pad 22 is connected to the source metal contact 25 for the source electrode 20. The bonding pad 42 is connected to the polysilicon gate electrode 40. The N-well 30 enclosing the P-field blocks 60, 61, 62 and 63 are connected from the drain electrode 10 to the source electrode 20. The portion of the N-well 30 located in between the P-field blocks 60, 61, 62 and 63 reduces the on-resistance of the channel.

The P-field blocks 60, 61, 62 and 63 are located in the extended drain region 50 of the N-well 30. The N-well 30, the P-field blocks 60, 61, 62 and 63 deplete the drift region, which build the electrical field in the N-well 30 to increase the breakdown voltage. In order to get higher breakdown voltage, the extended drain region 50 must be fully depleted before the breakdown occurs. The N-well 30 and P-field blocks 60, 61, 62 and 63 enable the extended drain region 50 to be depleted before the breakdown occurs even though the doping density of the drift region is high. This allows the drift region to have higher doping density and accomplish low resistance. The sizes of the P-field blocks can be optimized to achieve the desired effect. The doping density of the N-well 30 and the P-field blocks are properly determined to achieve the equalized capacitance. Therefore a high breakdown voltage and low on-resistance LDMOS transistor 100 can be realized. Furthermore, the portion of the N-well 30 formed by the second diffusion region 37 produces a low-impedance path for the source region 56, which restricts the current flow in between the drain region 52 and the source region 56.

The LDMOS transistor 100 of the present invention provides a simple structure to achieve high breakdown voltage, low on-resistance and isolation performance. Furthermore, low cost and high production yield are also accomplished.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A transistor comprising:
   a P-substrate;
   a first diffusion region and a second diffusion region having N conductivity-type ions formed in said P-substrate, wherein said first diffusion region comprises an extended drain region;
   a drain diffusion region containing N+ conductivity-type ions, forming a drain region in said extended drain region;
   a plurality of spaced apart P-field blocks formed in said extended drain region; wherein said P-field blocks have different sizes; wherein a smallest size P-field block is located nearest to said drain region; wherein said P-field blocks are used for generating junction fields;
   a source diffusion region having N+ conductivity-type ions, forming a source region in an N-well formed by said second diffusion region, wherein a largest size P-field block is located nearest to said source region;

a channel, formed between said drain region and said source region;

a polysilicon gate electrode, formed over said channel to control a current flow in said channel;

a contact diffusion region containing P+ conductivity-type ions, forming a contact region in said N-well formed by said second diffusion region; and an isolated P-well formed in said N-well formed by said second diffusion region for preventing from breakdown; wherein said isolated P-well formed in said second diffusion region encloses said source region and said contact region.

2. The transistor of claim 1, wherein said N-well formed by said second diffusion region produces a low-impedance path for said source region, and restricts said current flow in between said drain region and said source region.

3. The transistor of claim 1 further comprising:

a thin gate oxide and a thick field oxide, formed underneath said polysilicon gate electrode, a drain-gap, formed between said drain diffusion region and said thick field oxide to maintain a space between said drain diffusion region and said thick field oxide; and a source-gap, formed between said thick field oxide and said isolated P-well to maintain a space between said thick field oxide and said isolated P-well, wherein said drain-gap and said source-gap are used to increase breakdown voltage, wherein said drain-gap further reduces an on-resistance of said channel.

4. The transistor of claim 3, further comprising a silicon dioxide insulation layer, covering said polysilicon gate electrode and said thick field oxide.

5. The transistor of claim 1, further comprising:

a source metal contact having a first metal electrode, for contacting with said source diffusion region and said contact diffusion region; and a drain metal contact, having a second metal electrode, for contacting with said drain diffusion region.

6. The transistor of claim 5, further comprising:

a drain bonding pad, connected to said drain metal contact for a drain electrode;

a source bonding pad, connected to said source metal contact for a source electrode; and a gate bonding pad, connected to said polysilicon gate electrode.

7. The LDMOS transistor of claim 1, wherein said P-field blocks are formed in said extended drain region of said N-well, wherein said N-well and said P-field blocks deplete a drift region and equalize the capacitance of parasitic capacitors between said drain region and said source region, and decrease the on-resistance of said channel.

* * * * *